United States Patent
Shen

(10) Patent No.: US 9,620,652 B2
(45) Date of Patent: Apr. 11, 2017

(54) TFT AND MANUFACTURING METHOD THEREOF, ARRAY SUBSTRATE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Qiyu Shen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 42 days.

(21) Appl. No.: 14/500,243

(22) Filed: Sep. 29, 2014

(65) Prior Publication Data
US 2015/0280014 A1    Oct. 1, 2015

(30) Foreign Application Priority Data
Mar. 26, 2014    (CN) .......................... 2014 1 0115392

(51) Int. Cl.
*H01L 51/52*    (2006.01)
*H01L 29/786*    (2006.01)
*H01L 29/417*    (2006.01)

(52) U.S. Cl.
CPC .. *H01L 29/78696* (2013.01); *H01L 29/41733* (2013.01)

(58) Field of Classification Search
CPC ......... H01L 29/78696; H01L 29/41733; H01L 51/52
See application file for complete search history.

(56) References Cited

U.S. PATENT DOCUMENTS

| 6,274,884 B1 * | 8/2001 | Lee ....................... G02F 1/1368 257/57 |
| 2003/0022471 A1 | 1/2003 | Taketomi et al. |
| 2013/0270547 A1 * | 10/2013 | Hsu ........................ H01L 33/08 257/43 |

FOREIGN PATENT DOCUMENTS

| CN | 102034873 A | 4/2011 |
| JP | H02206173 A | 8/1990 |

OTHER PUBLICATIONS

The First Office Action dated Mar. 23, 2016 corresponding to Chinese application No. 201410115392.6.

* cited by examiner

*Primary Examiner* — Daniel Whalen
*Assistant Examiner* — Suberr Chi
(74) *Attorney, Agent, or Firm* — Nath, Goldberg & Meyer; Joshua B. Goldberg

(57) ABSTRACT

The present invention provides a TFT and a manufacturing method thereof, an array substrate and a display device. The TFT comprises a gate, an active layer located on the gate, an ohmic contact layer located on the active layer, and a first electrode and a second electrode located on the ohmic contact layer, wherein the first electrode and the second electrode are partially overlapped with the active layer, the ohmic contact layer is located within a region where the first electrode and the second electrode are overlapped with the active layer; the active layer is partially overlapped with the gate, the active layer comprises at least one opening region partially overlapped with the gate; and the first electrode and/or the second electrode extends beyond the active layer through the at least one opening region.

20 Claims, 4 Drawing Sheets

TFT AND MANUFACTURING METHOD THEREOF, ARRAY SUBSTRATE

FIELD OF THE INVENTION

The present invention relates to the field of display technology, and particularly relates to a TFT and a manufacturing method thereof and an array substrate.

BACKGROUND OF THE INVENTION

A TFT-LCD (Thin-Film Transistor Liquid Crystal Display) includes a color filter substrate, an array substrate and a liquid crystal layer enclosed between the color filter substrate and the array substrate, the array substrate including a TFT. Taking a bottom-gate type TFT as an example, as shown in FIG. 1, the TFT of the array substrate generally includes a gate 10, a gate insulating layer (not shown in FIG. 1) being located on the gate 10 and completely covering the gate 10, an active layer 20 located on the gate insulating layer, an ohmic contact layer 30 located on the active layer 20, and a source 41 and a drain 42 both located on the ohmic contact layer 30, wherein the projection of the active layer 20 on the gate 10 is completely located within the gate 10, the source 41 and the drain 42 are partially overlapped with the active layer 20, and the ohmic contact layer 30 is located within a region where the source 41 and the drain 42 are overlapped with the active layer 20.

When a negative bias is applied to the gate 10 of the TFT to turn off the TFT, electrons in the active layer 20 of the TFT will flow to the gate insulating layer due to the negative bias on the gate. As a result, holes are formed in the active layer 20. Particularly, in the region where the active layer 20 is overlapped with the source 41 and the drain 42 of the TFT, the junction where the active layer 20 is intersected with the source 41 and the gate 10 (see region a in FIG. 1) and the junction where the active layer 20 is intersected with the drain 42 and the gate 10 (see region b in FIG. 1), a plurality of holes are formed. In the region where the active layer 20 is overlapped with the source 41 and the drain 42, an ohmic contact layer 30 is formed between the active layer 20 and the film layers of both the source 41 and the drain 42. As the electrons in the ohmic contact layer 30 may neutralize most holes, the number of the holes within the region where the active layer 20 is overlapped with the source 41 and the drain 42 will be reduced greatly. While at the junction where the active layer 20 is intersected with the source 41 and the gate 10 and the junction where the active layer 20 is intersected with the drain 42 and the gate 10, as the active layer 20 is in direct contact with the source 41 and the drain 42, the number of the holes will not be reduced greatly, a large gate negative bias leakage current is generated, and flicker is further caused. As a result, the problem of poor display quality occurs.

In conclusion, at present, a large gate negative bias leakage current will be generated at the junction where an active layer is intersected with and a source and a gate and at the junction where the active layer is intersected with a drain and the gate when a negative bias is applied to the gate, thereby resulting in the problem of poor display quality.

SUMMARY OF THE INVENTION

Embodiments of the present invention provide a TFT and a manufacturing method thereof, and an array substrate, to solve the problem that a large gate negative bias leakage current will be generated at the junction where an active layer is intersected with a source and a gate and at the junction where the active layer is intersected with a drain and the gate when a negative bias is applied to the gate, thereby resulting in the problem of poor display quality.

In a first aspect, the embodiments of the present invention provide a TFT, including a gate, an active layer located on the gate, an ohmic contact layer located on the active layer, and a first electrode and a second electrode located on the ohmic contact layer, wherein the first electrode and the second electrode are partially overlapped with the active layer, and the ohmic contact layer is located within a region where the first electrode and the second electrode are overlapped with the active layer, wherein, the active layer is partially overlapped with the gate, and the active layer includes at least one opening region which is partially overlapped with the gate; and the first electrode and/or the second electrode extends beyond the active layer through the at least one opening region, The first electrode is a source and the second electrode is a drain; or, the first electrode is a drain and the second electrode is a source.

The TFT further includes a gate insulating layer located between the gate and the active layer to cover the gate.

Preferably, the active layer includes two opening regions; and the first electrode extends beyond the active layer through one of the two opening regions, and the second electrode extends beyond the active layer through the other opening region.

Preferably, the two opening regions are located on two opposite sides of the gate, respectively.

The active layer may further include an opening region located on one side between the two opposite sides of the gate.

Preferably, the active layer has a pattern of a Chinese character "中".

Preferably, the active layer has a pattern of a transversely-placed Chinese character "日".

Preferably, the two opening regions are located on two adjacent sides of the gate, respectively.

Preferably, the opening regions are rectangular, circular or elliptical in shape.

The size of an overlapping region in the active layer is determined according to the number of holes generated in a part of the active layer which is overlapped with the gate when a negative bias is applied to the gate, and the orthographic projection of the overlapping region is located outside the gate and the overlapping region is overlapped with the first electrode and/or the second electrode.

The ohmic contact layer is made of N-doped amorphous silicon and the active layer is made of amorphous silicon.

In a second aspect, the embodiments of the present invention provide an array substrate including the thin film transistor described above.

In a third aspect, the embodiments of the present invention provide a method for manufacturing a thin film transistor, including:

forming a gate on a base substrate;
forming an active layer on the gate;
forming an ohmic contact layer on the active layer;
forming a first electrode and a second electrode on the ohmic contact layer so that the first electrode and the second electrode are partially overlapped with the active layer, and the ohmic contact layer is located within a region where the first electrode and the second electrode are overlapped with the active layer, wherein the active layer is partially overlapped with the gate, and the active layer includes at least one opening region which is partially overlapped with the gate; and the first electrode and/or the second electrode extends beyond the active layer through the at least one opening region.

Between the step of forming a gate on the base substrate and the step of forming an active layer on the gate, the method may further include a step of forming a gate insulating layer on the gate to cover the gate.

The embodiments of the present invention have the following beneficial effects: the active layer is partially overlapped with the gate, the active layer includes at least one opening region which is partially overlapped with the gate, and the first electrode and/or the second electrode is partially overlapped with the active layer and extends beyond the active layer through the at least one opening region; when a negative bias is applied to the gate, a plurality of holes are generated at the junction where the active layer is intersected with the gate and the junction where the active layer is intersected with the first electrode and/or the second electrode; under the irradiation of the backlight source, a plurality of photo-generated electrons are generated in a region, exposed from the gate and overlapped with the first electrode and/or second electrode, of the active layer; under the effect of the negative bias on the gate, the photo-generated electrons flow back to the region of the active layer overlapped with the gate and neutralize the holes therein, so that the number of the holes generated at the junction where the active layer is intersected with the gate and at the junction where the active layer is intersected with the first electrode and/or second electrode is greatly reduced; consequently, the gate negative bias leakage current generated here becomes small, and the problem of poor display quality resulted from large gate negative bias leakage current is alleviated to some extent or avoided.

DETAILED DESCRIPTION OF THE INVENTION

Figure 1:
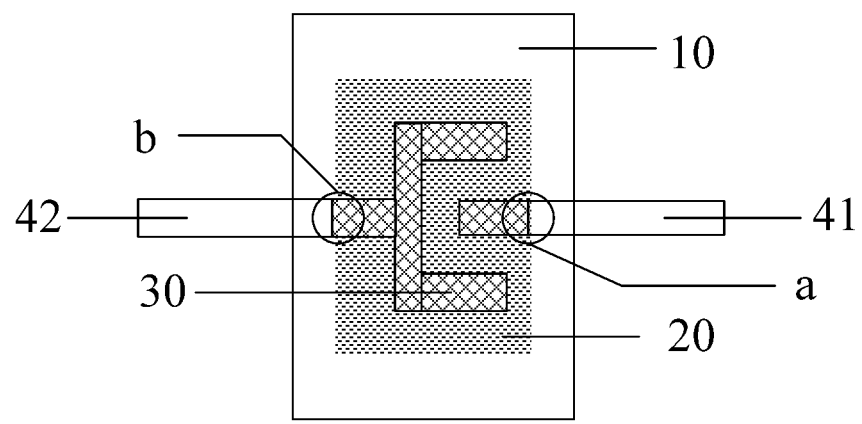
FIG. 1 is a structure diagram of a TFT in the prior art.

In embodiments of the present invention, the TFT includes a gate, an active layer located on the gate, an ohmic contact layer located on the active layer, and a first electrode and a second electrode located on the ohmic contact layer, wherein the first electrode and the second electrode are partially overlapped with the active layer, and the ohmic contact layer is located within a region where the first electrode and the second electrode are overlapped with the active layer; the active layer is partially overlapped with the gate, and the active layer includes at least one opening region partially overlapped with the gate; and the first electrode and/or the second electrode extends beyond the active layer through the opening regions. The first electrode is a source and the second electrode is a drain; or, the first electrode is a drain and the second electrode is a source.

Compared with the prior art, the shape of the active layer changes to some extent, wherein the first electrode and the second electrode are partially overlapped with the active layer; the active layer is partially overlapped with the gate, and the active layer includes at least one opening region partially overlapped with the gate; and the first electrode and/or the second electrode extends beyond the active layer through the opening regions.

Therefore, when a negative bias is applied to the gate, a plurality of holes are formed at the junction where the active layer is intersected with the gate and the junction where the active layer is intersected with the first electrode and/or second electrode; under the irradiation of the backlight source, a plurality of photo-generated electrons are formed in a position, exposed from the gate and overlapped with the first electrode and/or second electrode, on the active layer; under the effect of the negative bias on the gate, the photo-generated electrons flow back to the position of the active layer overlapped with the gate and neutralize the holes in the active layer, so that the holes formed at the junction where the active layer is intersected with the gate and the junction where the active layer is intersected with the first electrode and/or second electrode are greatly reduced; consequently, the gate negative bias leakage current generated here becomes small, and the problem of poor display quality resulted from large gate negative bias leakage current is alleviated to some extent or avoided.

The embodiment of the present invention will be further described in details as below with reference to the drawings.

It is to be noted that, an embodiment of the present invention is introduced by taking the fact that the gate is a bottom gate as an example. In a specific embodiment, the implementation manners of gates of other types (for example, top gate) are similar to those of the gate (bottom gate) described in the embodiments of the present invention and will not be described repeatedly here.

Preferably, the embodiment of the present invention provides a TFT, including a gate, an active layer located on the gate, an ohmic contact layer located on the active layer, and a first electrode and a second electrode located on the ohmic contact layer, wherein the first electrode and the second electrode are partially overlapped with the active layer, and the ohmic contact layer is located within a region where the first electrode and the second electrode are overlapped with the active layer, wherein, the active layer is partially overlapped with the gate, and the active layer includes at least one opening region partially overlapped with the gate; and the first electrode and/or the second electrode extends beyond the active layer through the opening regions.

The first electrode is a source and the second electrode is a drain; or, the first electrode is a drain and the second electrode is a source.

In this embodiment, by changing the shape of the active layer, the first electrode and the second electrode are partially overlapped with the active layer, the active layer is partially overlapped with the gate, and the active layer includes at least one opening region partially overlapped with the gate; and the first electrode and/or the second electrode extends beyond the active layer through the opening region.

Therefore, when a negative bias is applied to the gate, a plurality of holes are formed at the junction where the active layer is intersected with the gate and the junction where the active layer is intersected with the first electrode and/or second electrode; under the irradiation of the backlight source, a plurality of photo-generated electrons are formed in a position, exposed from the gate and overlapped with the first electrode and/or second electrode, on the active layer; under the effect of the negative bias on the gate, the photo-generated electrons flow back to the position of the active layer overlapped with the gate and neutralize the holes in the active layer, so that the holes formed at the junction where the active layer is intersected with the gate and the junction where the active layer is intersected with the first electrode and/or second electrode are greatly reduced; consequently, the gate negative bias leakage current generated here becomes small, the performance of the TFT is improved, and the problem of poor display quality resulted from large gate negative bias leakage current is alleviated to some extents or avoided.

Preferably, the TFT further includes a gate insulating layer located between the gate and the active layer to cover the gate.

It is to be noted that the active layer in this embodiment of the present invention includes at least one opening region. The implementation manners of the embodiments of the present invention will be introduced as below, respectively, according to different numbers of opening regions included in the active layer.

First case: the active layer includes one opening region.

Figure 2A:
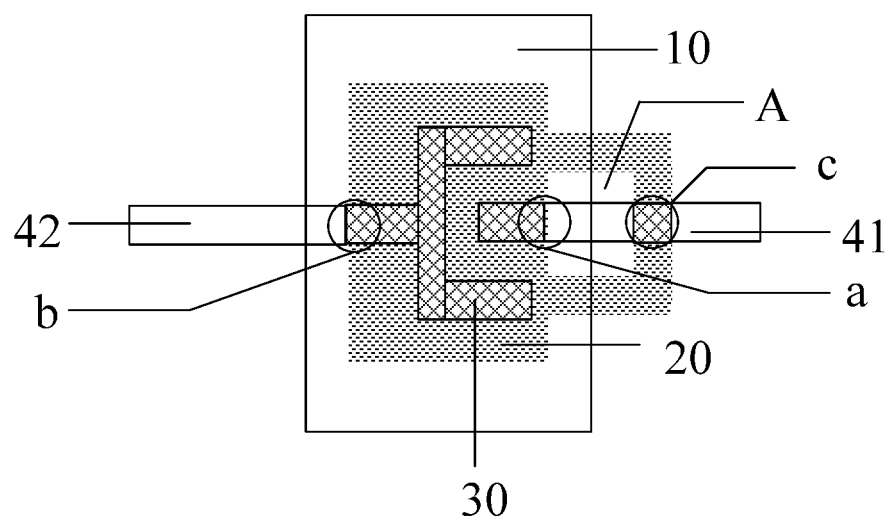
FIGS. 2A-2E are structure diagrams of a TFT according to an embodiment of the present invention.

Preferably, as shown in FIG. 2A, the embodiment of the present invention provides a TFT, including a gate 10, an active layer 20 located on the gate 10, an ohmic contact layer 30 located on the active layer 20, and a first electrode 41 and a second electrode 42 located on the ohmic contact layer 30, wherein the ohmic contact layer 30 is located within a region where the first electrode 41 and the second electrode 42 are overlapped with the active layer 20, wherein, the active layer 20 is partially overlapped with the gate 10, and the active layer 20 includes at least one opening region A partially overlapped with the gate 10; and the first electrode 41, partially overlapped with the active layer 20, extends beyond the active layer 20 through the opening region A.

In this embodiment, as shown in FIG. 2A, the junction where the active layer 20 is intersected with the gate 10 and the first electrode 41 is within a region a, while the junction where the active layer 20 is intersected with the gate 10 and the second electrode 42 is within a region b; and the position, exposed from the gate 10 and overlapped with the first electrode 41, on the active layer 20, is within a region c. The orthographic projection of region c is outside the gate 10, it thus may be irradiated by a backlight source.

When a negative bias is applied to the gate 10, a plurality of holes are formed within the region a and the region b in the active layer 20; under the irradiation of the backlight source, a plurality of photo-generated electrons are formed within the region c in the active layer 20; under the effect of the negative bias on the gate, the photo-generated electrons in the region c flow back to the position of the active layer 20 overlapped with the gate 10 and neutralize the holes in the active layer, so that the number of the holes formed in the region a and the region b are greatly reduced; consequently, the gate negative bias leakage current generated in the region a and the region b becomes small, the performance of the TFT is improved, and the problem of poor display quality resulted from large gate negative bias leakage current is alleviated to some extent or avoided.

It is to be noted that, in the embodiment of the present invention, the configuration that the first electrode partially overlapped with the active layer extends beyond the active layer through the opening region is taken as an example. In a specific embodiment, the implementation manner where the second electrode partially overlapped with the active layer extending beyond the active layer through the opening region is similar to that where the first electrode partially overlapped with the active layer extending beyond the active layer through the opening region, and thus will not be described repeatedly here.

Second case: the active layer includes two opening regions.

Preferably, the active layer includes two opening regions; and the first electrode extends beyond the active layer through one of the two opening regions, and the second electrode extends beyond the active layer through the other opening region.

The position of the two opening regions included in the active layer will not be limited. For example, the two opening regions are located on two opposite edges or adjacent edges of the active layer. The two typical situations will be introduced as below.

1. The two opening regions are located on two opposite edges the active layer.

Preferably, the two opening regions are located on two opposite sides of the gate, respectively.

Figure 2B:
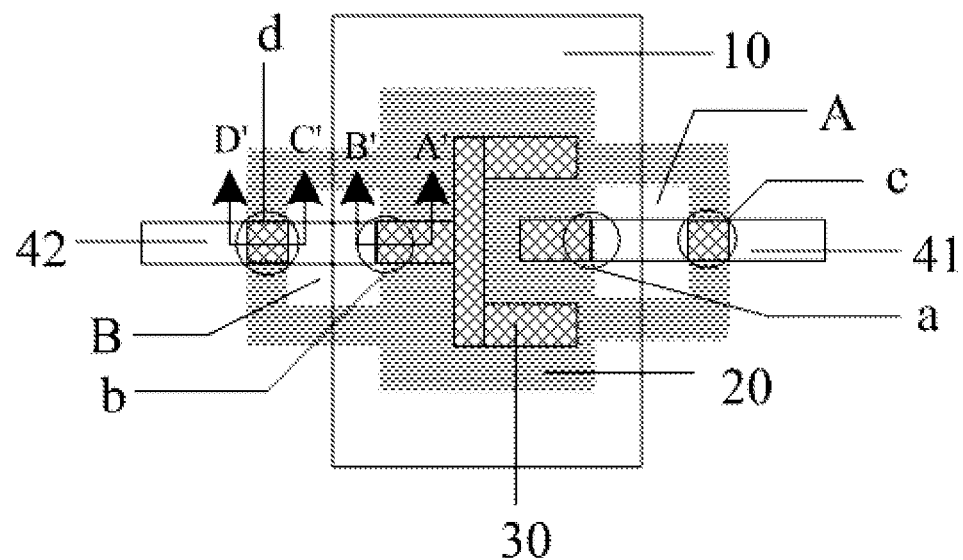

As shown in FIG. 2B, the embodiment of the present invention provides a TFT, including a gate 10, a gate insulating layer (not shown in FIG. 2B) being located on the gate 10 and completely covering the gate 10, an active layer 20 located on the gate insulating layer, an ohmic contact layer 30 located on the active layer 20, and a first electrode 41 and a second electrode 42 located on the ohmic contact layer 30, wherein the ohmic contact layer 30 is located within a region where the first electrode 41 and the second electrode 42 are overlapped with the active layer 20, wherein, the active layer 20 is partially overlapped with the gate 10, and the active layer 20 includes an opening region A and an opening region B respectively located on two sides of the gate 10, the opening region A and the opening region B being partially overlapped with the gate 10; and the first electrode 41, partially overlapped with the active layer 20, extends beyond the active layer 20 through the opening region A, while the second electrode 42, partially overlapped with the active layer 20, extends beyond the active layer 20 through the opening region B.

Figure 3:
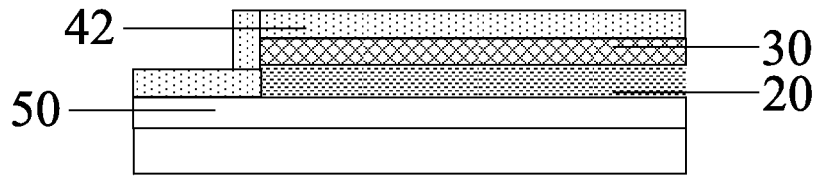
FIG. 3 is a structure diagram of a junction where an active layer is intersected with a gate and a second electrode according to an embodiment of the present invention.

In this embodiment, as shown in FIG. 2B, the junction where the active layer 20 is intersected with the gate 10 and the first electrode 41 is within a region a, while the junction where the active layer 20 is intersected with the gate 10 and the second electrode 42 is within a region b, wherein the sectional view of the region b (i.e., sectional view of FIG. 2B, made along line A'-B') is shown in FIG. 3. From FIG. 3, it can be seen that, within the region b, the active layer 20 is located between the gate insulating layer 50 and the ohmic contact layer 30 and in direct contact with the second electrode 42.

Figure 4:
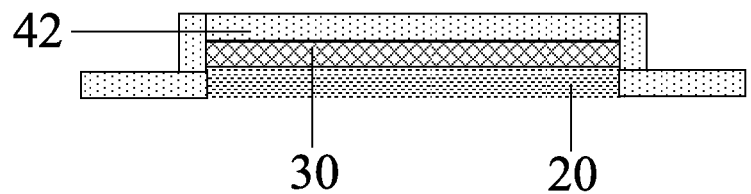
FIG. 4 is a structure diagram of a junction where the active layer is exposed from a gate and intersected with the second electrode according to an embodiment of the present invention.

As shown in FIG. 2B, within a region c, the orthographic projection of the active layer 20 is outside the gate 10 and overlapped with the first electrode 41; and within a region d, the orthographic projection of the active layer 20 is outside the gate 10 and overlapped with the second electrode 42, wherein the sectional view of the region d (i.e., sectional view of FIG. 2B, made along line C'-D') is shown in FIG. 4. From FIG. 4, it can be seen that the ohmic contact layer 30 is provided between the active layer 20 and the second electrode 42.

When a negative bias is applied to the gate 10, a plurality of holes are formed within the region a and the region b in the active layer 20 due to direct contact with the first electrode 41 and the second electrode 42; under the irradiation of the backlight source, a plurality of photo-generated electrons are formed within the region c and the region d in the active layer 20 due to direct contact with the ohmic contact layer 30; under the effect of the negative bias on the gate, the photo-generated electrons in the region c flow back to the position of the active layer 20 overlapped with the gate 10 and neutralize the holes in the active layer, so that the number of the holes formed in the region a are greatly reduced, and the photo-generated electrons in the region d flow back to the position of the active layer 20 overlapped with the gate 10 and neutralize the holes in the active layer, so that the number of the holes formed in the region b are greatly reduced; consequently, the gate negative bias leakage current generated in the region a and the region b becomes small, the performance of the TFT is improved, and the problem of poor display quality resulted from large gate negative bias leakage current is alleviated to some extent or avoided.

Preferably, in FIG. 2B, the active layer 20 has a pattern of a Chinese character "中". In a specific embodiment, the active layer 20 may has a pattern other than the Chinese character "中".

Figure 2C:
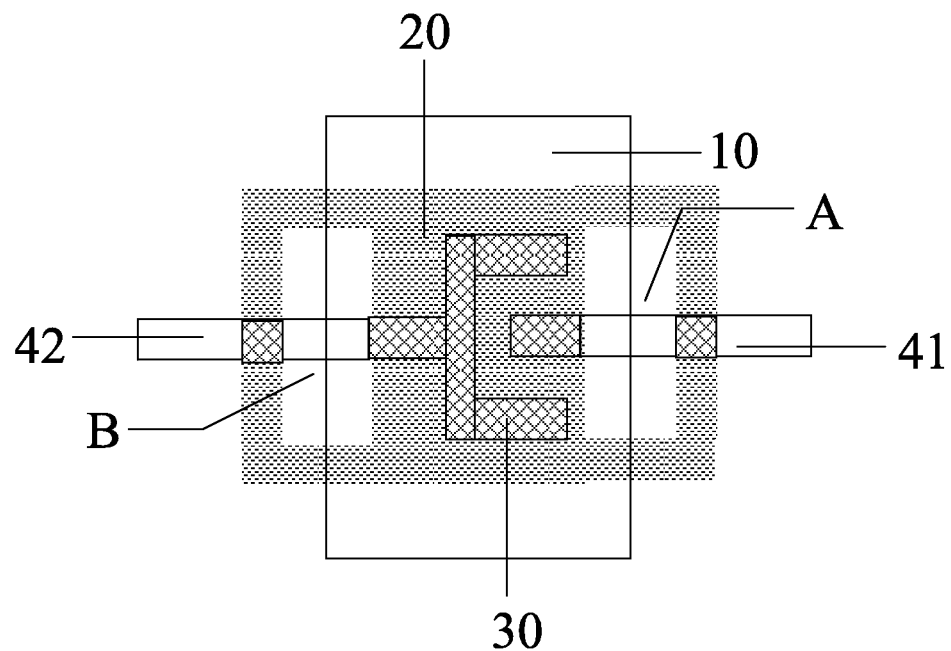

Preferably, as shown in FIG. 2C, the active layer 20 is has a pattern of transversely-placed Chinese character "日".

In this embodiment, when the active layer 20 has a pattern of a transversely-placed Chinese character "日", the principle of alleviating or avoiding the problem of poor display quality resulted from large gate negative bias leakage current is similar to that when the active layer 20 has a pattern of a Chinese character "中", and thus will not be described repeatedly here.

It is to be noted that, in specific implementations, the shape of the opening regions as shown in FIG. 2B and FIG. 2C may be other shapes than a rectangular shape, for example, an annular or elliptical shape. Therefore, the Chinese character "中" in this Chinese character "日" pattern is not limited to a rectangular structure, and it may be an annular or elliptical structure. Similarly, the transversally-placed Chinese character "日" pattern is also not limited to a rectangular structure, and it may be an annular or elliptical structure.

It is to be noted that, in FIG. 2B and FIG. 2C, the fact that the two opening regions are respectively located on two sides of the gate with one opening region being located in the first horizontal direction of the gate while the other opening region being located in the second horizontal direction of the gate is taken as an example. In specific implementations, the implementation manner, where the two opening regions are respectively located on two sides of the gate with one opening region being located in the first vertical direction of the gate while the other opening region being located in the second vertical direction of the gate, is similar to that as shown in FIG. 2B and FIG. 2C in the embodiment of the present invention, and thus will not be described repeatedly here.

2. The two opening regions are located on two adjacent edges of the active layer.

Preferably, the two opening regions are located on two adjacent sides of the gate.

Figure 2D:
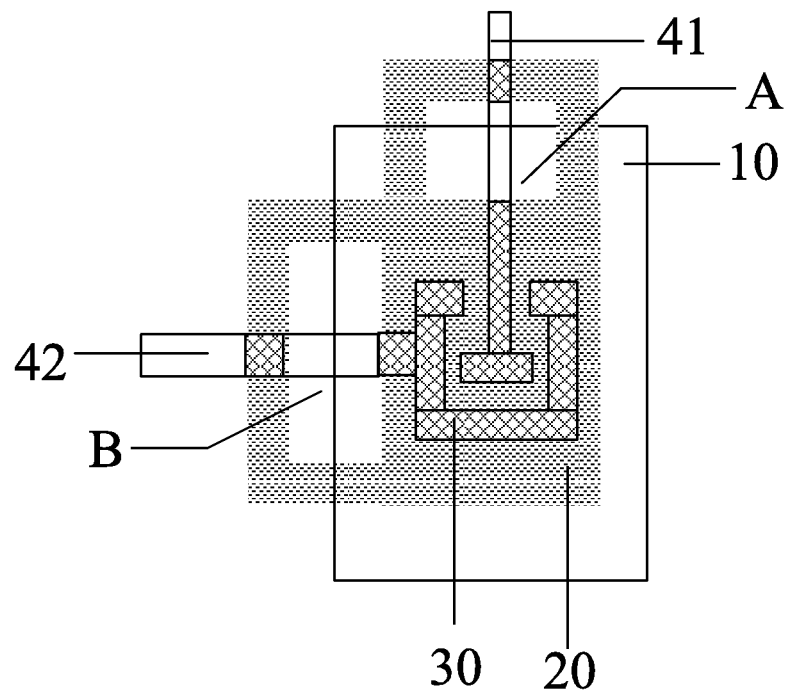

For example, as shown in FIG. 2D, the active layer 20 is partially overlapped with the gate 10, and the active layer 20 includes an opening region A and an opening region B partially overlapped with the gate 10; and the first electrode 41, partially overlapped with the active layer 20, extends beyond the active layer 20 through the opening region A, while the second electrode 42, partially overlapped with the active layer 20, extends beyond the active layer 20 through the opening region B, wherein the pattern of the gate 10 is rectangular, the active layer 20 has a pattern of a vertically-turned L shape, and the opening region A and opening region B of the active layer 20 are located on two adjacent sides of the gate 10.

In this embodiment, the principle of alleviating or avoiding the problem of poor display quality resulted from large gate negative bias leakage current with the TFT as shown in FIG. 2D is similar to that with the TFT as shown in FIG. 2B, and thus will not be described repeatedly here.

It is to be noted that, in this embodiment, similar to the implementation manners as shown in FIG. 2B and FIG. 2C, the shape of the opening regions as shown in FIG. 2D may be other shapes than a rectangular shape, for example, an annular or elliptical shape. Therefore, the Chinese character "中" in this Chinese character "中" pattern is not limited to a rectangular structure, and it may be an annular or elliptical structure. Similarly, the transversally-placed Chinese character "日" pattern is also not limited to a rectangular structure, and it may be an annular or elliptical structure.

3. The active layer includes three opening regions.

Figure 2E:
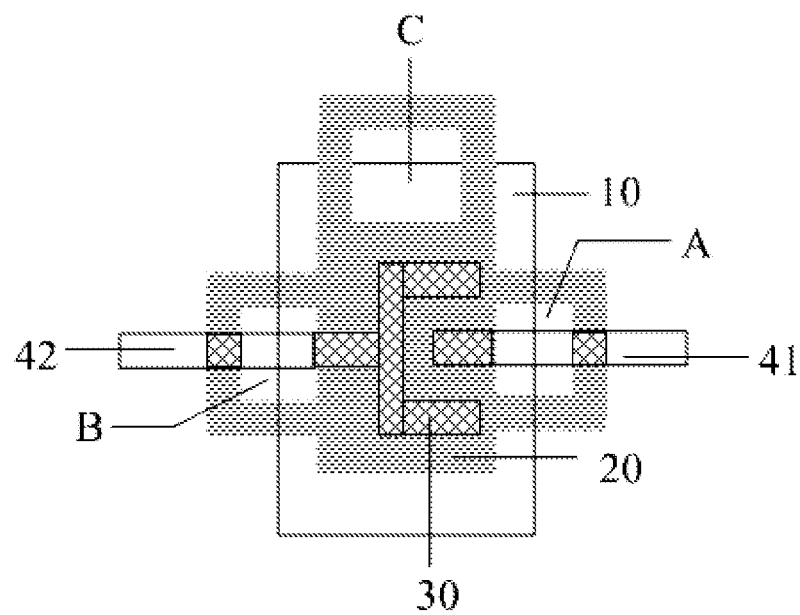

Preferably, as shown in FIG. 2E, the embodiment of the present invention provides a TFT, including a gate 10, an active layer 20 located on the gate 10, an ohmic contact layer 30 located on the active layer 20, and a first electrode 41 and a second electrode 42 located on the ohmic contact layer 30, wherein the ohmic contact layer 30 is located within a region where the first electrode 41 and the second electrode 42 are overlapped with the active layer 20, wherein, the active layer 20 is partially overlapped with the gate 10, and the active layer 20 includes an opening region A, an opening region B and an opening region C partially overlapped with the gate 10, respectively, wherein the opening region A and the opening region B are located on two opposite sides of the gate 10, respectively; and the first electrode 41, partially overlapped with the active layer 20, extends beyond the active layer 20 through the opening region A, while the second electrode 42, partially overlapped with the active layer 20, extends beyond the active layer 20 through the opening region B.

In this embodiment, the opening region A and the opening region B have a function that the problem of poor display quality resulted from large gate negative bias leakage current is alleviated to some extent or avoided, while the opening region C has no actual function to this problem.

In this embodiment, the principle of solving this problem with the TFT as shown in FIG. 2E is similar to that with the TFT shown in FIG. 2B, and thus will not be described repeatedly here.

It is to be noted that, a specific implementation manner of the active layer where the active layer includes more than three opening regions is similar to the specific implementation manner where the active layer includes three opening regions, and thus will not be described repeatedly here.

It is to be noted that, for the TFT as shown in FIGS. 2A-2E, the opening regions in a rectangular shape are taken as an example. However, in specific implementations, the shape of the opening regions may be determined according to specific requirements or by experience.

Preferably, the opening regions are rectangular, circular or elliptical in shape.

Preferably, the size of an overlapping region in the active layer is determined according to the number of holes generated in a part of the active layer which is overlapped with the gate when a negative bias is applied to the gate, and the orthographic projection of the overlapping region is located outside the gate and the overlapping region is overlapped with the first electrode and/or the second electrode. So that, the gate leakage current resulted from negative bias on the gate is balanced to the light leakage current resulted from light irradiation, and the leakage current, generated when the TFT is turned off, is minimized.

Preferably, the ohmic contact layer is made of N-doped amorphous silicon (i.e., n+a-Si) and the active layer is made of amorphous silicon (i.e., a-Si).

On the basis of a same inventive concept, the embodiments of the present invention provide an array substrate including the TFT.

On the basis of a same inventive concept, the embodiments of the present invention provide a display device including the array substrate. The display device may be a liquid crystal panel, electronic paper, an OLED panel, a mobile phone, a tablet computer, TV, a display, a notebook computer, a digital photo frame, a navigator or any other product or component having a display function.

Figure 5:
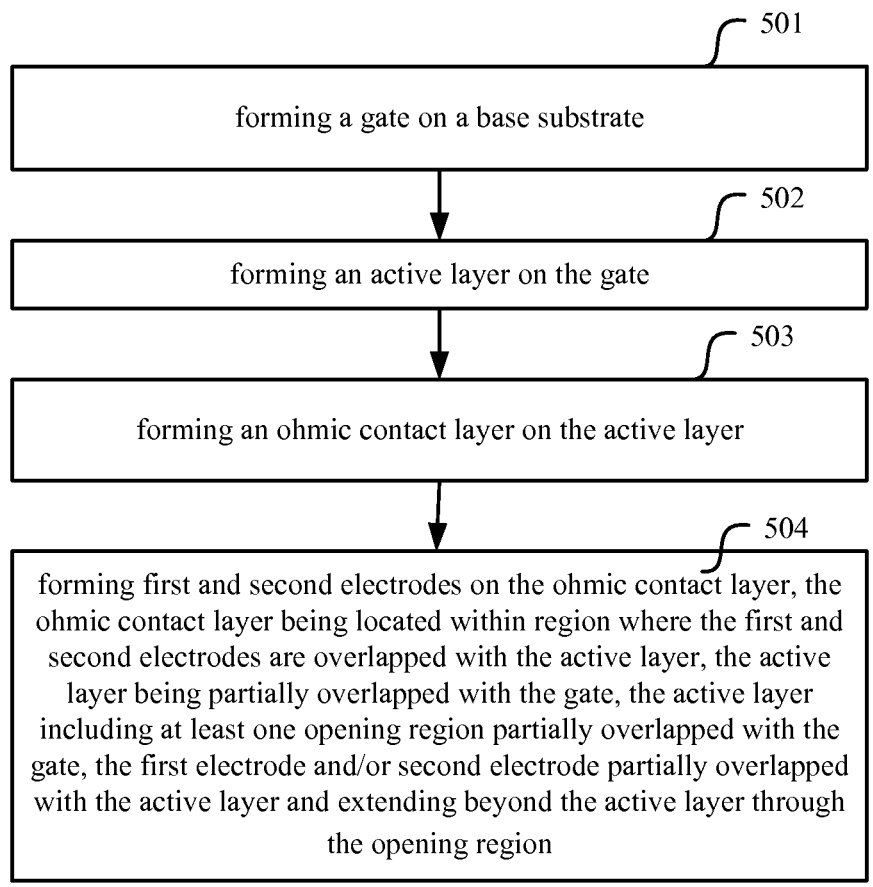
FIG. 5 is a flowchart of a method for manufacturing the TFT according to an embodiment of the present invention.

On the basis of a same inventive concept, as shown in FIG. 5, the embodiments of the present invention provide a method for manufacturing the TFT, including:

S501, forming a gate on a base substrate;

S502, forming an active layer on the gate;

S503, forming an ohmic contact layer on the active layer; and

S504, forming a first electrode and a second electrode on the ohmic contact layer so that the first electrode and the second electrode are partially overlapped with the active layer, and the ohmic contact layer is located within a region where the first electrode and the second electrode are overlapped with the active layer, wherein the active layer is partially overlapped with the gate, the active layer includes at least one opening region which is partially overlapped with the gate; and the first electrode and/or the second electrode extends beyond the active layer through the at least one opening region.

Preferably, after step S501 and before step S502, the method may further include forming a gate insulating layer on the gate to cover the gate.

The first electrode is a source and the second electrode is a drain; or, the first electrode is a drain and the second electrode is a source.

Although the preferred embodiments of the present invention have been described above, a person of ordinary skill in the art may make various alterations and modifications to these embodiments once knowing the concept of the present invention. Therefore, the appended claims are intended to be interpreted to include the preferred embodiments and all alterations and modifications within the scope of the present invention.

Obviously, a person of ordinary skill in the art may make various and variations to the present invention without departing from the spirit and scope of the present invention. Thus, if these changes and variations of the present invention are within the scope of the claims of the present invention and its equivalent technologies, the present invention is intended to include these changes and variants therein.

The invention claimed is:

1. A thin film transistor, comprising a gate, an active layer located on the gate, an ohmic contact layer located on the active layer, and a first electrode and a second electrode located on the ohmic contact layer, wherein the first electrode and the second electrode are partially overlapped with the active layer, and the ohmic contact layer is located within a region where the first electrode and the second electrode are overlapped with the active layer, wherein, the active layer is partially overlapped with the gate, and the active layer comprises at least one opening region which is partially overlapped with the gate and wherein the at least one opening region is provided inside the active layer so that the active: layer forms a closed loop; and the first electrode and/or the second electrode extends beyond the active layer through the at least one opening region, and is overlapped with the active layer outside the gate.

2. The thin film transistor according to claim 1, wherein the first electrode is a source and the second electrode is a drain; or, the first electrode is a drain and the second electrode is a source.

3. The thin film transistor according to claim 1, further comprising a gate insulating layer located between the gate and the active layer to cover the gate.

4. The thin film transistor according to claim 1, wherein the active layer comprises two opening regions; and the first electrode extends beyond the active layer through one of the two opening regions, and the second electrode extends beyond the active layer through the other opening region.

5. The thin film transistor according to claim 4, wherein the two opening regions are located on two opposite sides of the gate respectively.

6. The thin film transistor according to claim 5, wherein the openings of the active layer are formed horizontally opposite one another; and the active layer has a pattern of a Chinese character "中".

7. The thin film transistor according to claim 5, wherein the openings of the active layer are formed vertically opposite one another; and the active layer has a pattern of a transversely-placed Chinese character "日".

8. The thin film transistor according to claim 4, wherein the two opening regions are located on two adjacent sides of the gate respectively.

9. The thin film transistor according to claim 5, wherein the active layer further comprises an opening region located on one side between the two opposite sides of the gate.

10. The thin film transistor according to claim 4, wherein the opening regions are rectangular, circular or elliptical in shape.

11. The thin film transistor according to claim 8, wherein the opening regions are rectangular, circular or elliptical in shape.

12. The thin film transistor according to claim 1, wherein the size of an overlapping region in the active layer is determined according to the number of holes generated in a part of the active layer which is overlapped with the gate when a negative bias is applied to the gate, and the orthographic projection of the overlapping region is located outside the gate and the overlapping region is overlapped with the first electrode and/or the second electrode.

13. The thin film transistor according to claim 1, wherein the ohmic contact layer is made of N-doped amorphous silicon and the active layer is made of amorphous silicon.

14. An array substrate, comprising the thin film transistor according to claim 1.

15. The array substrate according to claim 14, wherein the active layer comprises two opening regions; and the first electrode extends beyond the active layer through one of the two opening regions, and the second electrode extends beyond the active layer through the other opening region.

16. The array substrate according to claim 15, wherein the two opening regions are located on two opposite sides of the gate respectively.

17. The array substrate according to claim 15, wherein the two opening regions are located on two adjacent sides of the gate respectively.

18. A method for manufacturing a thin film transistor, comprising the following steps of:
forming a gate on a base substrate;
forming an active layer on the gate;
forming an ohmic contact layer on the active layer; and
forming a first electrode and a second electrode on the ohmic contact layer so that the first electrode and the second electrode are partially overlapped with the active layer, and the ohmic contact layer is located within a region where the first electrode and the second electrode are overlapped with the active layer,
wherein the active layer is partially overlapped with the gate, and the active layer comprises at least one opening region which is partially overlapped with the gate and wherein the at least one opening region is provided inside the active layer so that the active layer forms a closed loop; and the first electrode and/or the second electrode extends beyond the active layer through the at least one opening region, and is overlapped with the active layer outside the gate.

19. The method for manufacturing a thin film transistor according to claim 18, further comprising a step of forming a gate insulating layer on the gate to cover the gate between the step of forming a gate on the base substrate and the step of forming an active layer on the gate.

20. The method for manufacturing a thin film transistor according to claim 18, wherein the active layer comprises two opening regions; and
the first electrode extends beyond the active layer through one of the two opening regions, and the second electrode extends beyond the active layer through the other opening region.

* * * * *